(12) United States Patent
Martiny

(10) Patent No.: US 7,550,956 B2
(45) Date of Patent: Jun. 23, 2009

(54) APPARATUS, SYSTEM, AND METHOD FOR DYNAMIC LOSS COMPENSATION FOR VOLTAGE CONVERTERS

(75) Inventor: Ingo Martiny, Halstenbek (DE)

(73) Assignee: Intel Corporation, Santa Clara, CA (US)

( * ) Notice: Subject to any disclaimer, the term of this patent is extended or adjusted under 35 U.S.C. 154(b) by 337 days.

(21) Appl. No.: 11/428,255

(22) Filed: Jun. 30, 2006

(65) Prior Publication Data

US 2008/0001629 A1     Jan. 3, 2008

(51) Int. Cl.
*G05F 1/40*     (2006.01)
*G05F 1/56*     (2006.01)

(52) U.S. Cl. .................. 323/282; 323/271

(58) Field of Classification Search ........... 323/222, 323/223, 225, 268, 271, 282, 283, 285
See application file for complete search history.

(56) References Cited

U.S. PATENT DOCUMENTS

| | | | |
|---|---|---|---|
| 6,552,517 B1 * | 4/2003 | Ribellino et al. ........... 323/282 |
| 6,661,210 B2 * | 12/2003 | Kimball et al. ............ 323/268 |
| 6,871,289 B2 * | 3/2005 | Pullen et al. .............. 713/300 |
| 6,894,471 B2 * | 5/2005 | Corva et al. ............... 323/282 |
| 7,249,267 B2 * | 7/2007 | Chapuis .................... 713/300 |
| 7,294,994 B2 * | 11/2007 | Ryu et al. .................. 323/282 |

OTHER PUBLICATIONS

Hazucha, P., et al., "A 233-MHz 80%-87% Efficient Four-Phase DC-DC Converter Utilizing Air-Core Inductors on Package", *IEEE Journal of Solid-State Circuits* 40(4), (Apr. 2005), 838-845.
Redl, R., et al., "Optimizing the Load Transient Response of the Buck Converter", *Proceedings, Thirteen Annual Applied Power Electronics Conference and Exposition (APEC '98)*, vol. 1, (1998), 170-176.

* cited by examiner

*Primary Examiner*—Matthew V Nguyen
(74) *Attorney, Agent, or Firm*—Schwegman, Lundberg & Woessner, P.A.

(57) ABSTRACT

Some embodiments of the invention include a control circuit to control a value of output voltage based on a feedback voltage. The feedback voltage is provided by a feedback circuit based on sense voltage that is related to the output voltage. A compensation circuit modifies the feedback voltage based on the sense voltage to further assist the control circuit to control the value of output voltage. Other embodiments are described and claimed.

16 Claims, 7 Drawing Sheets

US 7,550,956 B2

APPARATUS, SYSTEM, AND METHOD FOR DYNAMIC LOSS COMPENSATION FOR VOLTAGE CONVERTERS

FIELD

Embodiments of the present invention relate generally to supplying power for circuits, and particularly to voltage regulators.

BACKGROUND

Electrical devices need power to operate. Some devices are designed to operate within a specified operating power or voltage range. Outside the specified voltage range, the device may operate improperly. In situations where the value of the supply voltage is different from the value of the specified voltage range of the device, a voltage converter may be used to convert the different value of the supply voltage to meet the specified voltage range of the device.

A typical converter usually has some parasitic resistances between various circuit nodes of the converter. The parasitic resistances may cause a current or voltage loss. The performance of the converter may suffer if the loss is improperly compensated. In some converters, compensating the loss caused by all parasitic resistances is a challenge.

DESCRIPTION OF THE DRAWINGS

Figure 1:
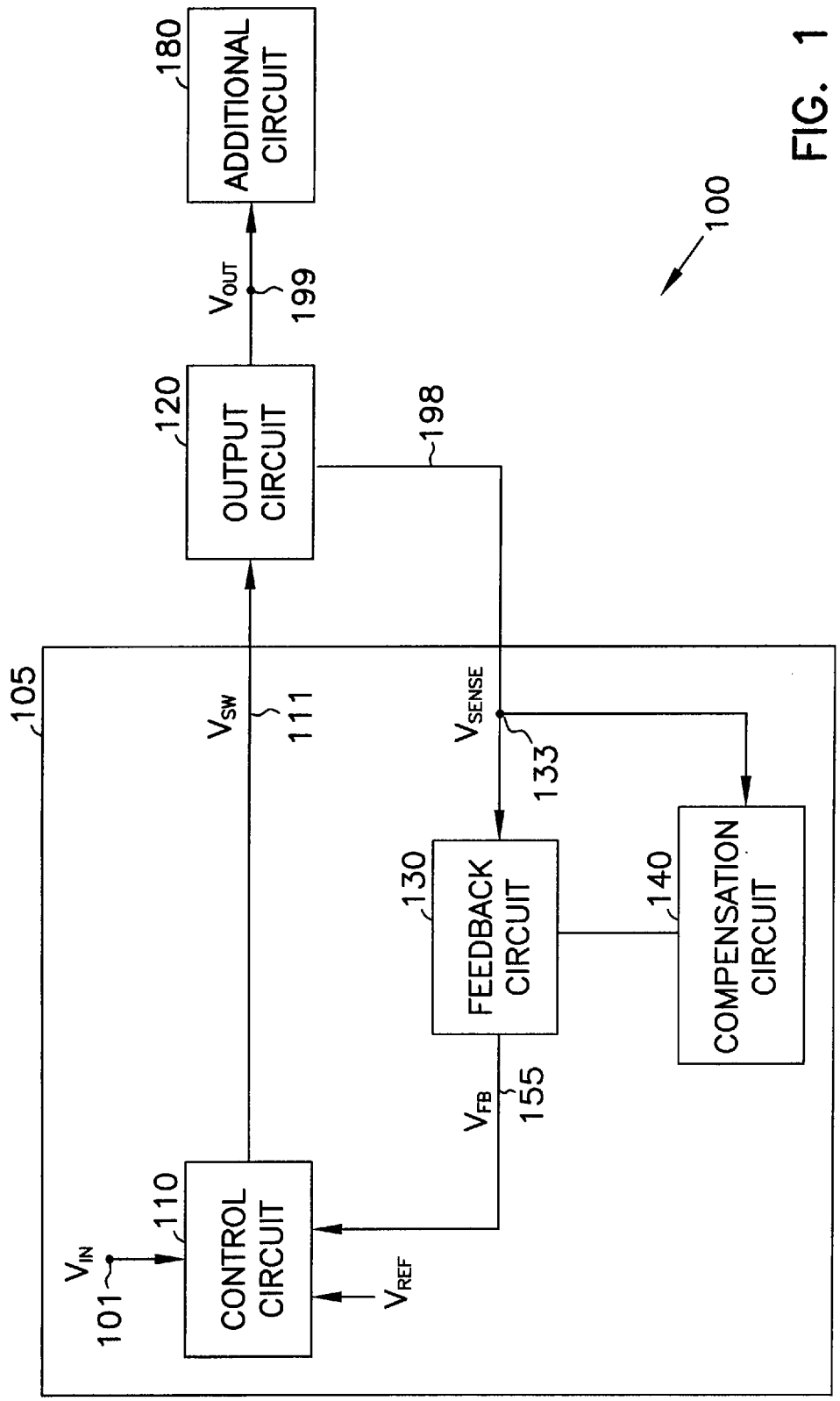
FIG. 1 shows an apparatus having a voltage converter according to an embodiment of the invention.

FIG. 1 shows an apparatus 100 having a voltage converter according to an embodiment of the invention. A control circuit 110 controls a transfer of power from a supply node 101 to a switch node 111. $V_{IN}$ is an input voltage representing the power or voltage at supply node 101. $V_{SW}$ is a switch voltage representing the voltage at switch node 111. An output circuit 120 receives $V_{SW}$ and provides an output voltage ($V_{OUT}$) at an output node 199. $V_{IN}$ and $V_{OUT}$ may have different voltage values. An additional circuit 180 may use $V_{OUT}$ as its supply voltage. Control circuit 110 controls the transfer of power from supply node 101 to switch node 111 to control $V_{OUT}$ to keep $V_{OUT}$ at an average voltage value of an output voltage range. A feedback circuit 130 interacts with control circuit 110 and output circuit 120 to create the average voltage value for $V_{OUT}$. Feedback circuit 130 may also act as a filter to reduce a droop of $V_{OUT}$ to control circuit 110. A sense node 133 has a sense voltage ($V_{SENSE}$). $V_{SENSE}$ is related to $V_{OUT}$.

In some embodiments, sense node 133 may be directly coupled to output node 199 such that $V_{SENSE}$ is substantially equal to $V_{OUT}$. In other embodiments, sense node 133 may be coupled to a circuit element (e.g., a voltage divider) of output circuit 120 such that $V_{SENSE}$ is proportional to $V_{OUT}$ (e.g., $V_{SENSE}$ is less than $V_{OUT}$). In FIG. 1, based on $V_{SENSE}$, feedback circuit 130 provides feedback information, in the form of a feedback voltage ($V_{FB}$), at feedback node 155. Control circuit 110 may compare $V_{FB}$ with a reference voltage ($V_{REF}$) to control the transfer of power from supply node 101 to switch node 111 to control $V_{OUT}$. In some embodiments, $V_{REF}$ may be generated by apparatus 100 or by another circuit outside apparatus 100. A compensation circuit 140 also uses $V_{SENSE}$ and interacts with feedback circuit 130 to conditionally modify $V_{FB}$ to further assist control circuit 110 to control the transfer of power from supply node 101 to switch node 111. Compensation circuit 140 may also compensate for a loss in voltage in apparatus 100 in which the loss may be caused by parasitic resistance in apparatus 100.

In some embodiments, control circuit 110 controls the transfer of power from supply node 101 to switch node 111 by controlling the switching cycles (periods) at switch node 111. Each switching cycle may include a transferring time interval and a suspending time interval. During the transferring time interval, control circuit 110 may couple switch node 111 to supply node 101 through a circuit path within control circuit 110 to transfer power from supply node 101 to switch node 111. During the suspending time interval, control circuit 110 may decouple switch node 111 from supply node 101 to suspend the transfer of power from supply node 101 to switch node 111. By coupling switch node 111 to, and decoupling switch node 111 from, supply node 101 in each switching cycle, control circuit 110 controls the voltage value of $V_{SW}$ to keep $V_{OUT}$ at the average voltage value and within the output voltage range.

As shown in FIG. 1, apparatus 100 also includes a die 105. In some embodiments, die 105 is a semiconductor die (e.g., silicon die) in which some circuit elements of apparatus 100, such as control circuit 110, feedback circuit 130, and compensation circuit 140, are formed. FIG. 1 shows output circuit 120 and additional circuit 180 being outside die 105. In some embodiments, a portion of output circuit 120 or a portion of additional circuit 180 may be formed inside die 105. In other embodiments, a portion of output circuit 120 and a portion of additional circuit 180 may be formed inside die 105. In some other embodiments, both output circuit 120 and additional circuit 180 may be formed inside die 105. FIG. 1 also shows sense node 133 being coupled to output circuit 120 via a connection 198. As shown in FIG. 1, where at least a portion of output circuit 120 is outside die 105, at least a portion of connection 198 may be is outside die 105 and outside output circuit 120. In some embodiments, at least a portion of connection 198 may be formed on a circuit board. The arrangement of apparatus 100 may allow for a flexible placement of compensation circuit 140 or sense node 133 or both so that compensation for the voltage loss caused by the parasitic resistances may be improved. For example, compensation circuit 140 or sense node 133 may be located as close as possible to output node 199 or to additional circuit 180. Control circuit 110, feedback circuit 130, compensation circuit 140, and at least a portion of output circuit 120 may represent the voltage converter of apparatus 100.

Figure 2:
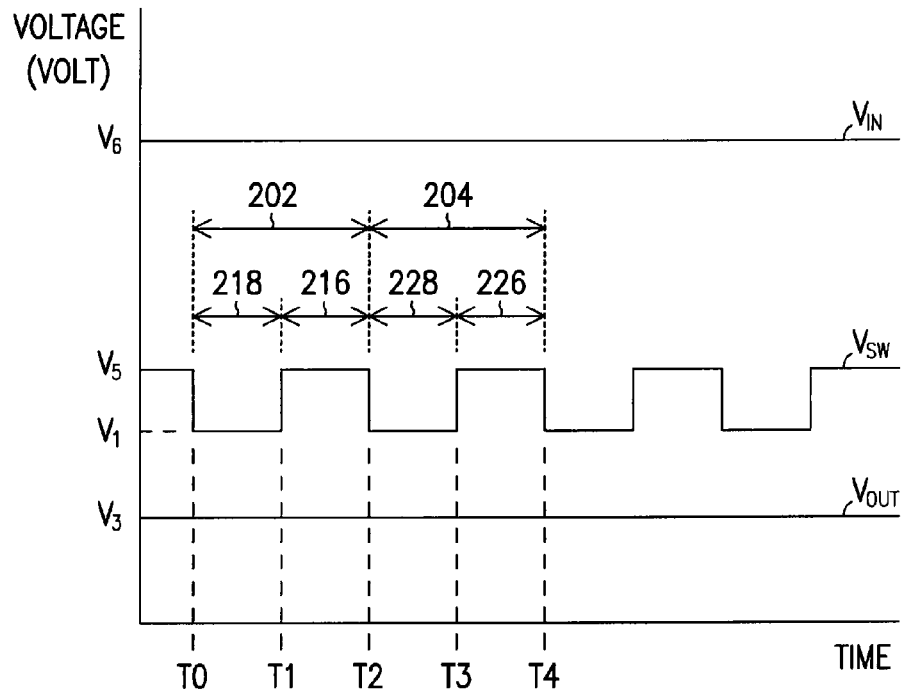
FIG. 2 is an example timing diagram for FIG. 1 including an average voltage value of an output voltage according to an embodiment of the invention.

FIG. 2 is an example timing diagram for FIG. 1 including an average voltage value of $V_{OUT}$. In FIG. 2, V1, V3, V5, and V6 represent voltage values (volts). FIG. 2 shows switching cycles 202 and 204 with suspending time intervals 218 and 228 and transferring time intervals 216 and 226. FIG. 2 shows $V_{IN}$, $V_{SW}$, and $V_{OUT}$ on the same timing diagram for purposes of describing FIG. 1. The positions of V1, V3, V5, and V6 on the vertical voltage axis are unrelated to the voltage values of V1, V3, V5, and V6. For example, although V3 is shown in a lower position than V1, V3 may be greater than V1.

Regarding FIG. 1 and FIG. 2, during each of the suspending time intervals 218 and 228, control circuit 110 decouples switch node 111 from supply node 101, causing the voltage value of $V_{SW}$ to be at V1. During each of the transferring time intervals 216 and 226, control circuit 110 couples switch node 111 to supply node 101, causing the voltage value of $V_{SW}$ to be at V5. In some embodiments, V1 may be ground and V5 is greater than V1. As shown in FIG. 2, $V_{OUT}$ and $V_{IN}$ maintain at voltage values V3 and V6, respectively, while $V_{SW}$ changes between V1 and V5. As described in FIG. 1, control circuit 110 controls the switching cycles at switch node 111 to control the voltage value of $V_{SW}$ to keep $V_{OUT}$ at an average voltage value and within an output voltage range. In FIG. 2, V3 indicates the average voltage value of $V_{OUT}$.

Figure 3:
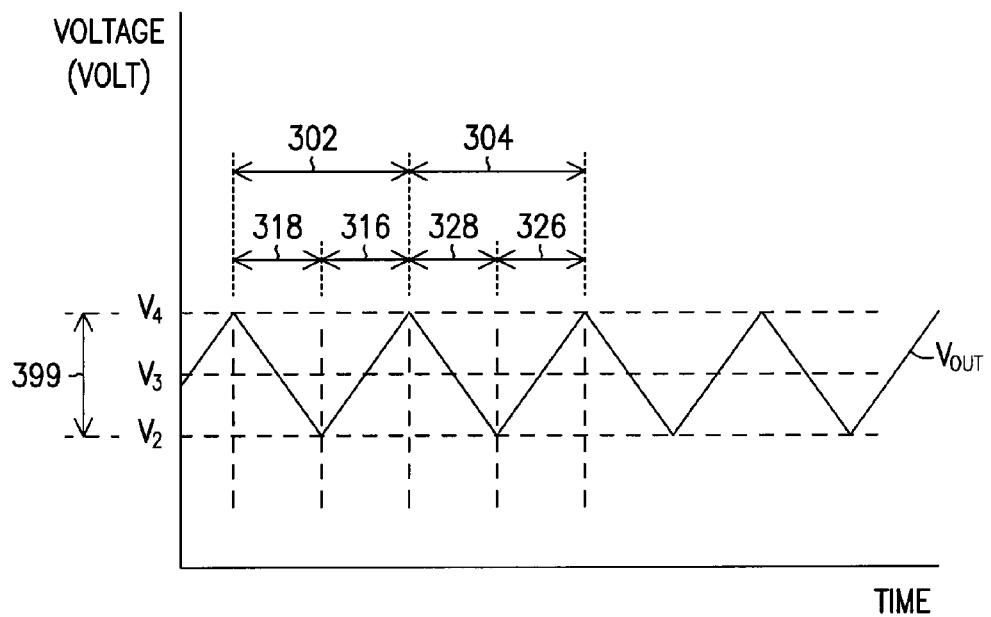
FIG. 3 is an example timing diagram for FIG. 1 including an output voltage range of an output voltage according to an embodiment of the invention.

FIG. 3 is an example timing diagram for FIG. 1 including the output voltage range of $V_{OUT}$. In FIG. 3, V2, V3, and V4 represent voltage values. FIG. 3 also shows switching cycles 302 and 304 with suspending time intervals 318 and 328 and transferring time intervals 316 and 326. V3 represents the average voltage value of $V_{OUT}$. FIG. 3 shows an output voltage range 399 of $V_{OUT}$ with V2 being the lower voltage value of output voltage range 399 and V4 being the upper voltage value of output voltage range 399. In some embodiments, the difference between V4 and V2 may be less than 2% of V3. For example, the difference between V4 and V2 may be less than 18 millivolts when V3 is about 0.9 volts. As described in FIG. 1, control circuit 110 controls the switching cycles (e.g., 302 and 304 in FIG. 3) at switch node 111 to keep $V_{OUT}$ at an average voltage value (e.g., V3 in FIG. 3) and within an output voltage range (e.g., 399 in FIG. 3). In some embodiments, apparatus 100 of FIG. 1 may include embodiments of FIG. 4 and FIG. 8 described below.

Figure 4:
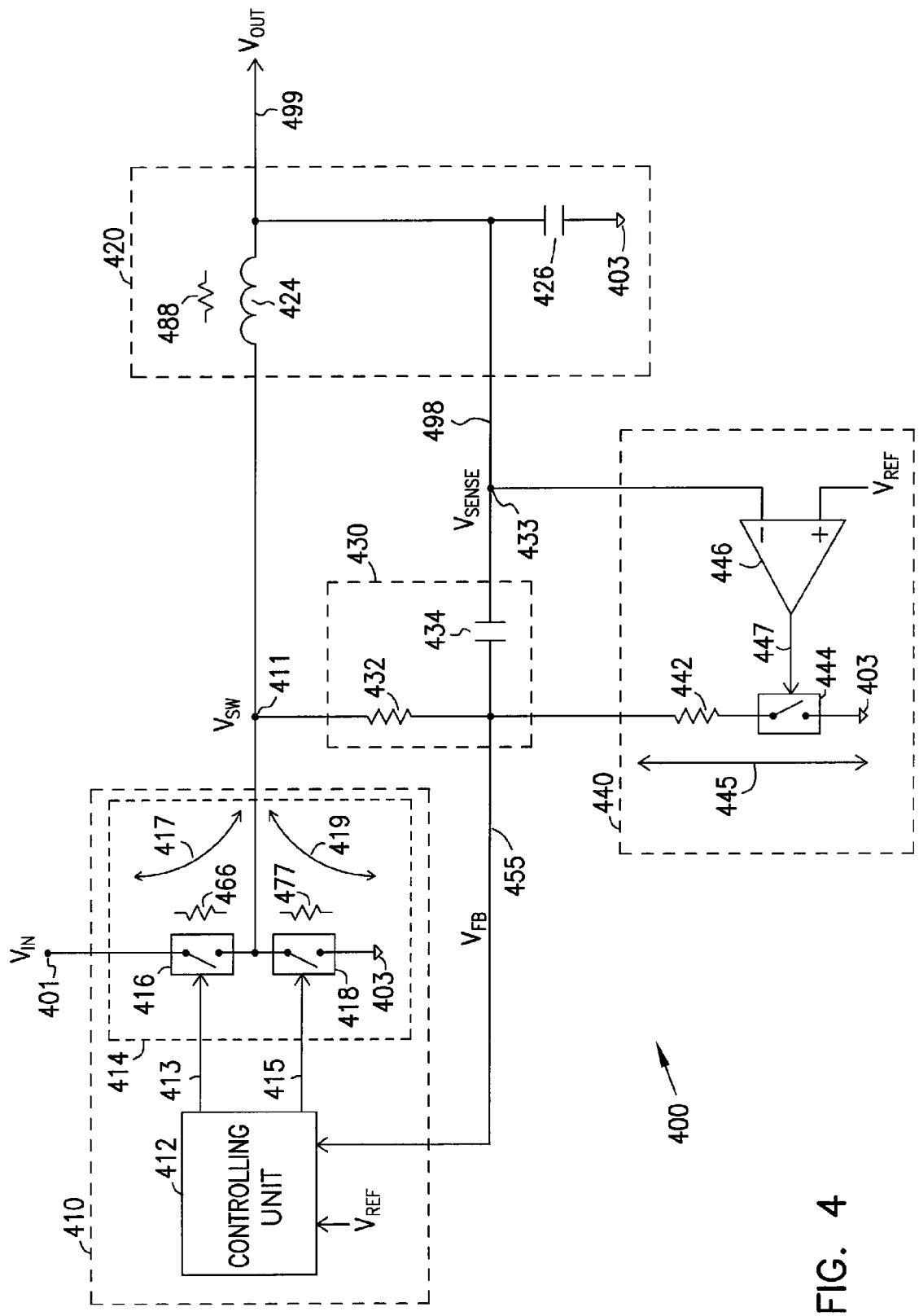
FIG. 4 shows a voltage converter according to an embodiment of the invention.

FIG. 4 shows a voltage converter 400 according to an embodiment of the invention. A control circuit 410 includes a controlling unit 412 to provide a feedback indication at each of the nodes 413 and 415 to selectively turn on and off switches 416 and 418 of a switching unit 414. Controlling unit 412 provides the feedback indication at nodes 413 and 415 based on a feedback voltage ($V_{FB}$). In some embodiments, controlling unit 412 may compare $V_{FB}$ with a reference voltage ($V_{REF}$) to provide the feedback indication based on the result of the comparison. $V_{REF}$ may be generated by voltage converter 400 or by another circuit outside voltage converter 400. In some embodiments, $V_{REF}$ may be set to a voltage value that is substantially equal to the average voltage value of $V_{OUT}$. In FIG. 4, the feedback indication at nodes 413 and 415 corresponds to either a high signal level or a low signal level at each of the nodes 413 and 415. Switches 416 and 418 are turned on or off based on the high and low signal levels at nodes 413 and 415. For example, switch 416 is turned on when node 413 has a high signal level and turned off when node 413 has a low signal level. When one switch (e.g., 416) is turned on, the other switch (418) is turned off. In some embodiments, switches 416 and 418 may include transistors.

A switch node 411 is coupled to a supply node 401 through a circuit path 417 when switch 416 is turned on, and decoupled from supply node 401 when switch 416 is turned off. Switch node 411 is coupled to a supply node 403 through a circuit path 419 when switch 418 is turned on, and decoupled from supply node 403 when switch 418 is turned off. Controlling unit 412 may be configured such that it turns on only one of the switches 416 and 418 at a time. In some embodiments, controlling unit 412 may be configured such that it turns off both switches 416 and 418 before it turns on one of the switches (e.g., either 416 or 418) to avoid contention at switch node 411. In some embodiments, controlling unit 412 may include a comparator with a switching hysterisis control circuitry such that controlling unit 412 maintains the status of switches 416 and 418 when $V_{FB}$ is greater than a lower feedback voltage value and less than an upper feedback voltage value of the feedback voltage range. In the embodiments with the switching hysterisis control circuitry, control unit 412 may change the status of switches 416 and 418 only when $V_{FB}$ reaches the lower feedback voltage value or the upper feedback voltage value of the feedback voltage range. For example, controlling unit 412 may turn on switch 416 when $V_{FB}$ reaches the lower feedback voltage value and turn on switch 418 when $V_{FB}$ reaches the upper feedback voltage value of the feedback voltage range.

An output circuit 420 in FIG. 4 includes an inductor 424 and a capacitor 426 to provide an output voltage $V_{OUT}$ at an output node 499. In some embodiments, $V_{OUT}$ may have an average voltage value within an output voltage range.

A feedback circuit 430 includes a resistor 432 and a capacitor 434 to provide $V_{FB}$ at a feedback node 455. $V_{FB}$ is related to a sense voltage $V_{SENSE}$ at a sense node 433 such that the voltage value of $V_{FB}$ follows the voltage value of $V_{SENSE}$. In the embodiment represented by FIG. 4, sense node 433 is coupled to output node 499 via a connection 498. Therefore, $V_{SENSE}$ may be substantially equal to $V_{OUT}$. As described above, controlling unit 412 uses $V_{FB}$, which is provided by feedback circuit 430, to control the switching of switches 416 and 418 to control $V_{OUT}$.

A compensation circuit 440 includes a resistor 442, a switch 444, and a comparator 446. Comparator 446 controls switch 444 based on the result of the comparison between $V_{SENSE}$ and $V_{REF}$. Comparator 446 provides node 447 with a compensation indication, which is the result of the comparison between $V_{SENSE}$ and $V_{REF}$. The compensation indication at node 447 may correspond to either a high signal level or a low signal level at node 447. By opening and closing circuit path 445 between feedback node 455 and supply node 403 based on the compensation indication, compensation circuit 440 may either allow or prevent a current to flow between feedback node 455 and supply node 403. The $V_{FB}$ at feedback node 455 is modified when circuit path 445 is opened and closed. Thus, by controlling switch 444, compensation circuit 440 modifies the voltage value of $V_{FB}$. In some embodiments, compensation circuit 440 may be configured such that the time interval of switch 444 being turned on is less than the switching cycle (period) at switch node 411. Since control circuit 410 uses $V_{FB}$ to control the switching cycles at switch node 411 to control $V_{OUT}$, and since compensation circuit 440 modifies $V_{FB}$, compensation circuit 440 also affects the control of the switching cycles at switch node 411 to control $V_{OUT}$. In some embodiments, switch 444 may include transistors.

Resistor 442 of compensation circuit 440 may be referred to as a compensation resistor. As shown in FIG. 4 circuit path 417 may have a parasitic resistance 466 between supply node 401 and switch node 411; circuit path 419 may have a parasitic resistance 477 between switch node 411 and supply node 403; and inductor 424 may have a parasitic resistance 488 between switch node 411 and output node 499. Parasitic resistance 466 may include a resistance across switch 416 when switch 416 is turned on. Parasitic resistance 477 may include a resistance of switch 418 when switch 418 is turned on.

A voltage loss or voltage drop may exist in each of these parasitic resistances 466, 477, and 488. Thus, the output current between switch node 411 and output node 499, and the output $V_{OUT}$ may be affected when voltage converter 400 operates. With the arrangements of the circuit elements of voltage converter 400 as shown in FIG. 4, voltage converter 400 may compensate for the voltage loss in the circuit network between supply node 401 and output node 499 in which the voltage loss may include the voltage loss caused by parasitic resistances 466, 477, and 488. With the arrangement of voltage converter 400 as shown in FIG. 4, the compensation by voltage converter 400 may be independent of the input voltage $V_{IN}$ at supply node 401, independent of the source and location of the voltage loss, independent of the output current at output node 499, and relatively fast and efficient during each switching cycle at switch node 411.

Figure 5:
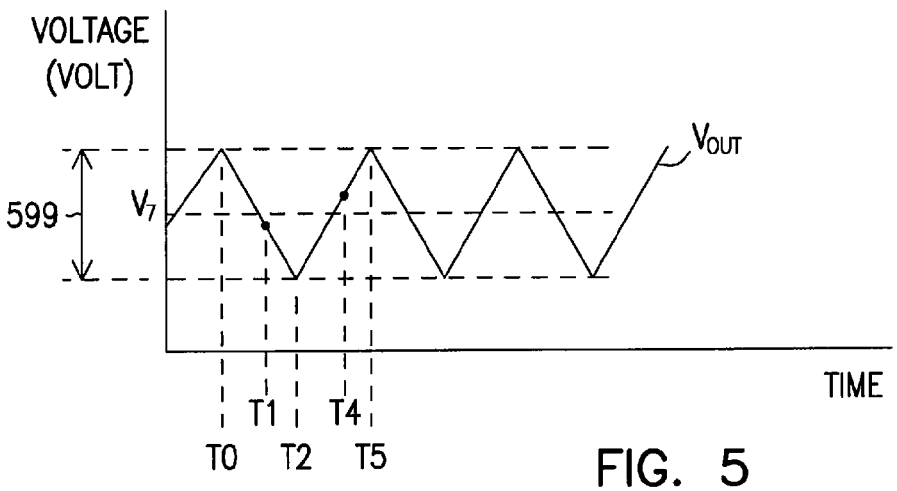
FIG. 5, FIG. 6, and FIG. 7 are example timing diagrams for FIG. 4 according to an embodiment of the invention.
Figure 6:
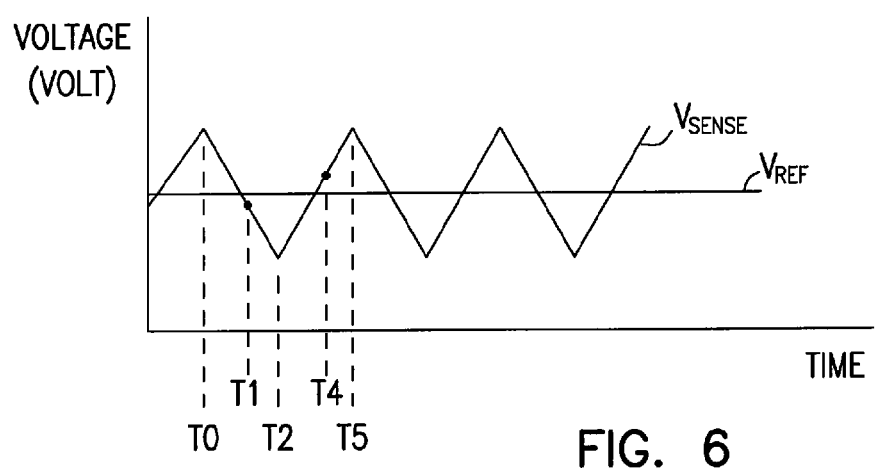
Figure 7:
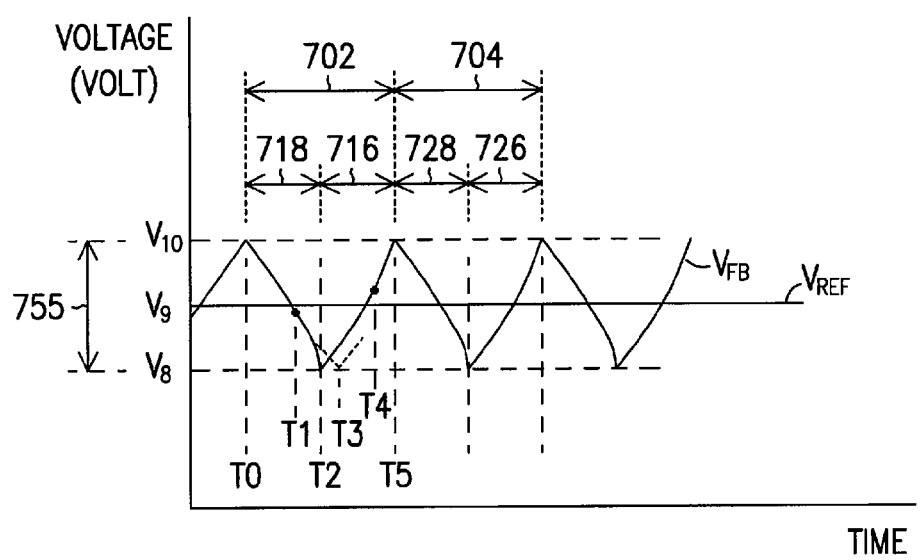

FIG. 5, FIG. 6, and FIG. 7 are example timing diagrams for FIG. 4. FIG. 5 shows $V_{OUT}$ having an average voltage value V7 and an output voltage range 599. FIG. 6 shows $V_{SENSE}$ and $V_{REF}$. Since sense node 433 of FIG. 4 is coupled to output node 499, $V_{SENSE}$ may follow the direction of $V_{OUT}$, as shown in FIG. 5 and FIG. 6. $V_{REF}$ in FIG. 6 may be an average of $V_{SENSE}$. In some embodiments, $V_{REF}$ in FIG. 6 may correspond to V7 of FIG. 5. FIG. 7 shows $V_{FB}$ having a feedback voltage range 755 with V8 and V10 being the lower voltage value and upper voltage value of feedback voltage range 755. $V_{REF}$ may be an average of $V_{FB}$. In some embodiments, feedback voltage range 755 may be the voltage range of a switching hysteresis control circuitry of controlling circuit 412 of FIG. 4. FIG. 7 also shows switching cycle 702 with a suspending time intervals 718 and a transferring time interval 716, and switching cycle 704 with a suspending time intervals 728 and a transferring time interval 726. During time intervals 718 and 728, switch 418 may be turned on and switch 416 may be turned off. During time intervals 716 and 726, switch 418 may be turned off and switch 416 may be turned on.

Voltage converter 400 of FIG. 4 operates to maintain $V_{OUT}$ within output voltage range 599 as shown in FIG. 5.

At time T0 in FIG. 5, FIG. 6, and FIG. 7, for purposes of describing the operation of voltage converter 400 of FIG. 4, it is assumed that switch 416 is turned off, meaning that switch node 411 is decoupled from supply node 401; switch 418 is turned on, meaning that switch node 411 is coupled to supply node 403 through circuit path 419; switch 444 is turned off, meaning that circuit path 445 is open; it is also assumed that $V_{OUT}$ is greater than the average voltage V7, as shown in FIG. 5; $V_{SENSE}$ is greater than $V_{REF}$, as shown in FIG. 6; and $V_{FB}$ is greater than $V_{REF}$, as shown in FIG. 7.

In FIG. 5, from time T0 to time T1, $V_{OUT}$ may decrease and become less than V7 at time T1. In FIG. 6, from time T0 to time T1, $V_{SENSE}$ may also decrease and become less than $V_{REF}$ at time T1. In FIG. 7, from time T0 to time T1, $V_{FB}$ may also decrease and become less than $V_{REF}$ at time T1. Although $V_{FB}$ is less than $V_{REF}$ at time T1, $V_{FB}$ is still greater than V8 at time T1. Therefore, at time T1 controlling unit 412 (FIG. 4) still maintains the status of switches 416 and 418 such that switch node 411 is still being coupled to supply node 403.

As described above in FIG. 4, comparator 446 may turn on switch 444 when $V_{SENSE}$ is less than $V_{REF}$, indicating that $V_{OUT}$ may be less than its average voltage value. Thus, when $V_{SENSE}$ is less than $V_{REF}$, at time T1 in FIG. 6, comparator 446 turns on switch 444. As a result, circuit path 445 is closed. A current flows from feedback node 455 to supply node 403, creating a voltage drop across resistor 442. The voltage drop modifies $V_{FB}$ such that the voltage value of $V_{FB}$ is decreased and may reach the lower feedback voltage V8, as shown in FIG. 7.

At time T2 in FIG. 7, since $V_{FB}$ reaches V8, controlling unit 412 changes the status of switches 416 and 418 by turning off switch 418 and turning on switch 416 at the start of suspending time interval 716. Circuit path 419 is opened when switch 418 is turned off at time T2 thereby decoupling switch node 411 from supply node 403. Circuit path 417 is closed when switch 416 is turned on at time T2 thereby coupling switch node 411 to supply node 401. The voltage value of $V_{OUT}$ begins to increase when switch node 411 is coupled to supply node 401. As shown in FIG. 5, $V_{OUT}$ may begin to increase at time T2.

Referring to FIG. 7, $V_{FB}$ reaches V8 after compensation circuit 440 turns on switch 444 at time T1. If compensation circuit 440 is omitted from FIG. 2, $V_{FB}$ may reach V8 at time T3 (which is later than T2) because $V_{FB}$ may not be affected by a voltage drop at time T1 such as the voltage drop across resistor 442. Therefore, if compensation circuit 440 is omitted from FIG. 4, the start of suspending time interval 716 may be delayed until time T3, thereby $V_{OUT}$ may not change direction to go back to the average voltage V7 until time T3. Compensation circuit 440, as described above, dynamically creates circuit path 445 to reduce the voltage value of $V_{FB}$ when $V_{SENSE}$ is less than $V_{REF}$ (e.g., at time T1) to cause controlling unit 412 to turn on switch 416 earlier than in the situation where compensation circuit 440 is omitted from FIG. 2. Thus, the start of suspending time interval 716 may also be earlier (e.g., at time T2 instead of time T3), thereby $V_{OUT}$ may change direction to go back to the average voltage value V7 earlier than in the situation where compensation circuit 440 is omitted from FIG. 2.

In FIG. 5, from time T2 to time T5, $V_{OUT}$ may increase. In FIG. 6, from time T2 to time T5, $V_{SENSE}$ may increase. At time T4, $V_{SENSE}$ may become greater than $V_{REF}$. In FIG. 4, when $V_{SENSE}$ is greater than $V_{REF}$, comparator 446 turns off switch 444. As a result, circuit path 445 is opened. In FIG. 7, between time T2 and T5, $V_{FB}$ may increase and reach the upper feedback voltage value V10 at time T5. The situation from time T5 is similar to the situation from time T0. Thus, the operation of voltage converter 400 from time T5 may be similar to that from time T0. That is, voltage converter 400 of FIG. 4 operates to maintain $V_{OUT}$ within output voltage range 599 as shown in FIG. 5.

As described in FIG. 1 through FIG. 7, apparatus 100 and voltage converter 400 control $V_{OUT}$ by sensing $V_{SENSE}$ (which is based on $V_{OUT}$) and modifying the feedback voltage $V_{FB}$ to control the switching cycle (e.g. 702 and 704 in FIG. 7) at switch node 411 to control $V_{OUT}$. Therefore, in controlling the switching cycle at switch node 411 to control $V_{OUT}$, voltage converter 400 may not use a pulse width modulation circuit, in which the pulse width modulation circuit may have a signal with a predetermined or non-varying frequency to control the switching cycle (or duty cycle) at switch node 411. Since voltage converter 400 may not use a pulse width modulation circuit with signal having a predetermined or non-varying frequency, apparatus 100 and voltage converter 400 may allow for a relatively faster response to the condition (e.g., a decrease in voltage value of $V_{OUT}$) at output node 499.

Figure 8:
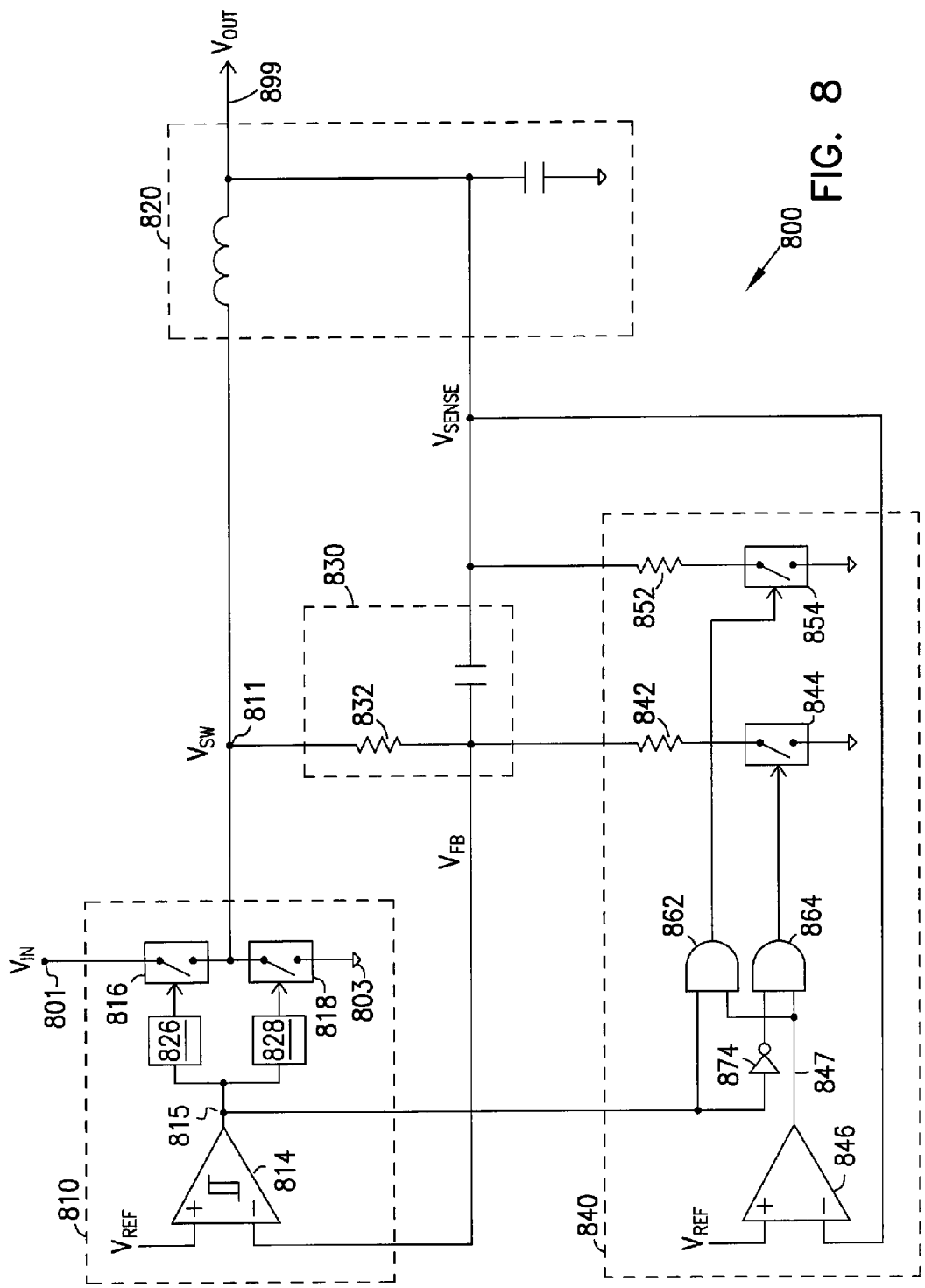
FIG. 8 shows a voltage converter having multiple compensation resistors according to an embodiment of the invention.

FIG. 8 shows a voltage converter 800 having multiple compensation resistors according to an embodiment of the invention. Voltage converter 800 includes a control circuit 810, an output circuit 820, a feedback circuit 830, and a compensation circuit 840. Voltage converter 800 senses $V_{SENSE}$ to modify $V_{FB}$ to control the switching cycles at switch node 811 so that $V_{OUT}$ is within an output voltage range. Control circuit 810 includes a comparator 814 having a switching hysteresis control circuitry. In some embodiments, comparator 814 may be used in controlling unit 412 of voltage converter 400 of FIG. 4.

In FIG. 8, comparator 814 may cause drivers 826 and 828 to change the status of switches 816 and 818 when $V_{FB}$ reaches a lower or an upper feedback voltage value of a feedback voltage range of $V_{FB}$. Compensation circuit 840 includes comparator 846, multiple resistors 842 and 852, and switches 844 and 854. Switch 854 is controlled by a logic AND gate 862 based on a first combination of the signal levels at node 815 and 847. Switch 844 is controlled by a logic AND gate 864 and an inverter 874 based on a second combination of the signal levels at node 815 and 847. The signal level at node 815 represents a feedback indication from a result of the comparison between $V_{FB}$ and $V_{REF}$ in which the comparison is performed by comparator 846. The signal level at node 847 represents a compensation indication from a result of the comparison between $V_{SENSE}$ and $V_{REF}$. With arrangement of voltage converter 800 as shown in FIG. 8, switches 844 and 854 are alternatively turned on such that one switch (e.g., 844) is turned on when node 815 has a low signal level and the other switch (e.g., 854) is turned on when node 815 has a high signal level, providing that node 847 has a high signal level when switch 844 or 854 is turned on.

Voltage converter 800 may have parasitic resistances such as those of voltage converter 400 of FIG. 4. For example, voltage converter 800 may have parasitic resistances between supply node 801 and supply node 803 and between switch node 811 and node 899. Resistors 842 and 852 may be referred to as compensation resistors. The arrangement of voltage converter 800 as shown in FIG. 8 may allow the value resistors 842 and 852 to be independently chosen to improve the compensation for the parasitic resistances of voltage converter 800. Further, the efficiency of voltage converter 800 may also be determined by choosing the values for resistors 832, 842, and 852, and the size of switches 844 and 854. In embodiments where switches 844 and 854 are field effect transistors, the size of switches 844 and 854 may be determined by transistor channel length, transistor channel width, or the ratio of the transistor channel length to transistor channel width.

Figure 9:
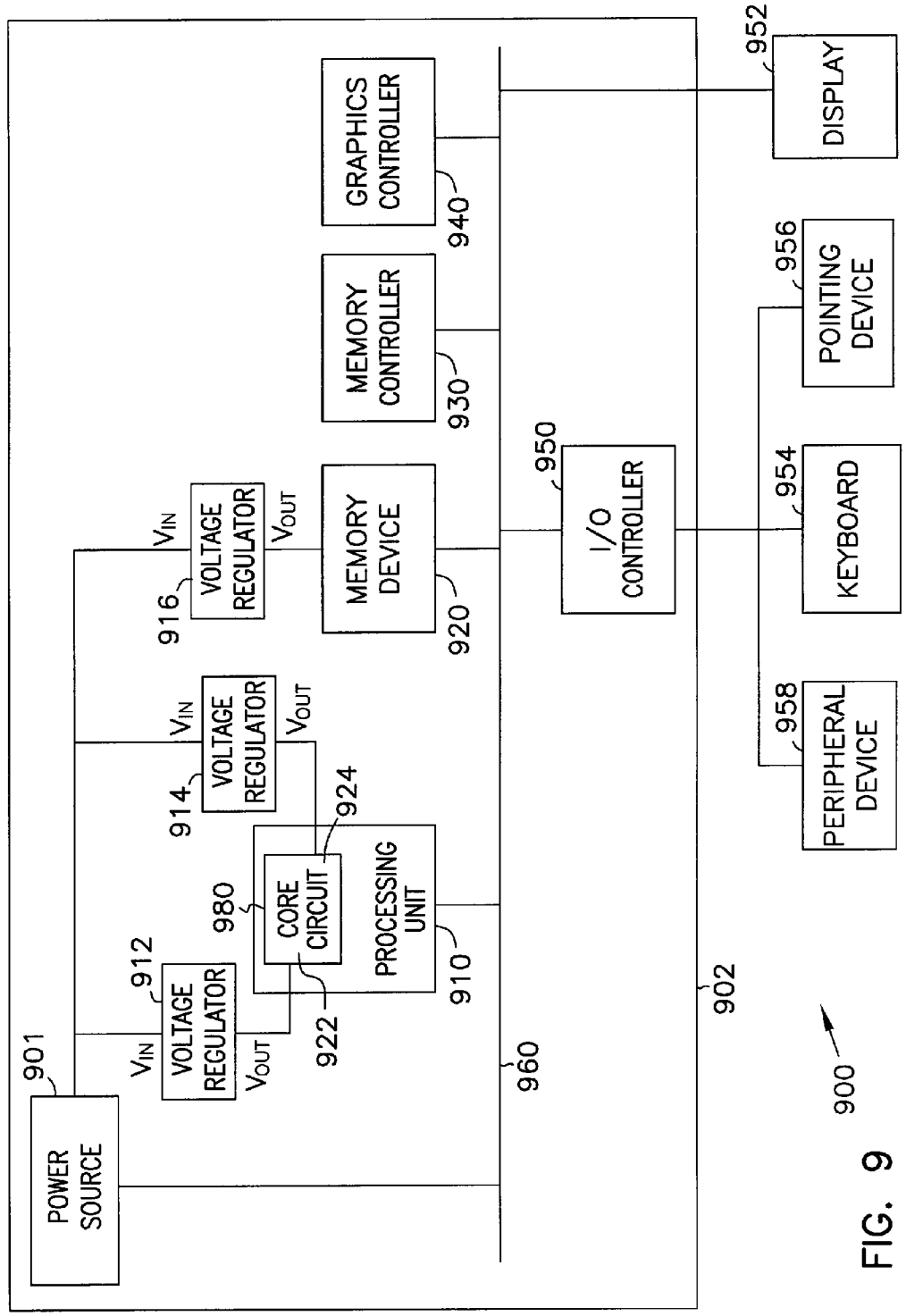
FIG. 9 shows a system according to an embodiment of the invention.

FIG. 9 shows a system according an embodiment of the invention. System 900 includes a power source 901 to provide an input voltage $V_{IN}$, voltage regulators 912, 914, and 916, each providing an output voltage $V_{OUT}$ based on $V_{IN}$, a processing unit 910, a memory device 920, a memory controller 930, a graphics controller 940, an input and output (I/O) controller 950, a display 952, a keyboard 954, a pointing device 956, a peripheral device 958, and a bus 960. System 900 also includes a circuit board 902 on which some components of system 900 are located, as shown in FIG. 9. Power source 901 may be provided by an alternating current to direct current (AC to DC) converting circuitry or by a battery. Memory device 920 may be a dynamic random access memory (DRAM) device, a static random access memory (SRAM) device, a flash memory device, or a combination of these memory devices. I/O controller 950 may include a communication module for wired or wireless communication.

FIG. 9 shows three voltage regulators 912, 914, and 916 as an example. In some embodiments, system 900 may include additional voltage regulators similar to voltage regulators 912, 914, and 916. The additional voltage regulators may receive $V_{IN}$ from power source 901 to provide an output voltage, such as $V_{OUT}$, to other components of system 900 (e.g., memory controller 930 and I/O controller 950). The voltage values of $V_{OUT}$ from the additional voltage regulators of system 900 may have the same or different voltage values.

Processing unit 910 includes a core circuit 980 to process data transferred to and from other components via bus 960. Core circuit 980 may include an embodiment of additional circuit 180 of FIG. 1. In FIG. 9, processing unit 910 may include a general purpose processor or an application specific integrated circuit (ASIC). FIG. 9 shows processing unit 910 having one core circuit 980 as an example. In some embodiments, processing unit 910 may include multiple core circuits, such as a multiple of core circuit 980, in which each of the multiple core circuits may receive $V_{OUT}$ from one or more voltage regulators similar to voltage regulators 912 and 914.

In some embodiments, at least one of the voltage regulators 912, 914, and 916 may include embodiments of apparatus 100 (FIG. 1) and voltage converters 400 and 800 (FIG. 4 and FIG. 8). Thus, at least one of the voltage regulators 912, 914, and 916 may include a control circuit, a feedback circuit, a compensation circuit, and an output circuit such as those of apparatus 100 and voltage converters 400 and 800.

FIG. 9 shows each of the voltage regulators 912, 914, and 916 as a single component separated from other components. In some embodiments, in at least one of the voltage regulators 912, 914, and 916, one or more portions of the voltage regulator may be incorporated into other components or may be located on circuit board 902. For example, an output circuit of voltage regulator 912 (such as output circuit 120, 420, or 820 of FIG. 1, 2, or 8) may be located outside voltage regulator 912 (e.g., on circuit board 902).

In other embodiments, in at least one of the voltage regulators 912, 914, and 916, at least a portion of the output circuit of the voltage regulator (e.g., the inductor, the capacitor, or both) may be located outside the voltage regulator (e.g., on circuit board 902) and the rest of voltage regulator may be incorporated into other components. For example, in the output circuit of voltage regulator 912, the inductor, the capacitor, or both may be located outside voltage regulator 912 and the rest of voltage regulator 912 may be incorporated into processing unit 910.

FIG. 9 shows multiple voltage regulators 912 and 914 coupled to core circuit 980 of processing unit 910 as an example. In some embodiments, one voltage regulator or more than two voltage regulators (similar to voltage regulators 912 and 914) may be coupled core circuit 980. As shown in FIG. 9, voltage regulators 912 and 914 are coupled to different circuit areas 922 and 924 of core circuit 980. Voltage regulators 912 and 914 may have the same value or different values for $V_{OUT}$. Using multiple voltage regulators in one processing unit, such as processing unit 910, may improve power management for processing unit 910. For example, when circuit area 922 of core circuit 980 is inactive, voltage regulator 912 may be deactivated to save power.

System 900 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 10:
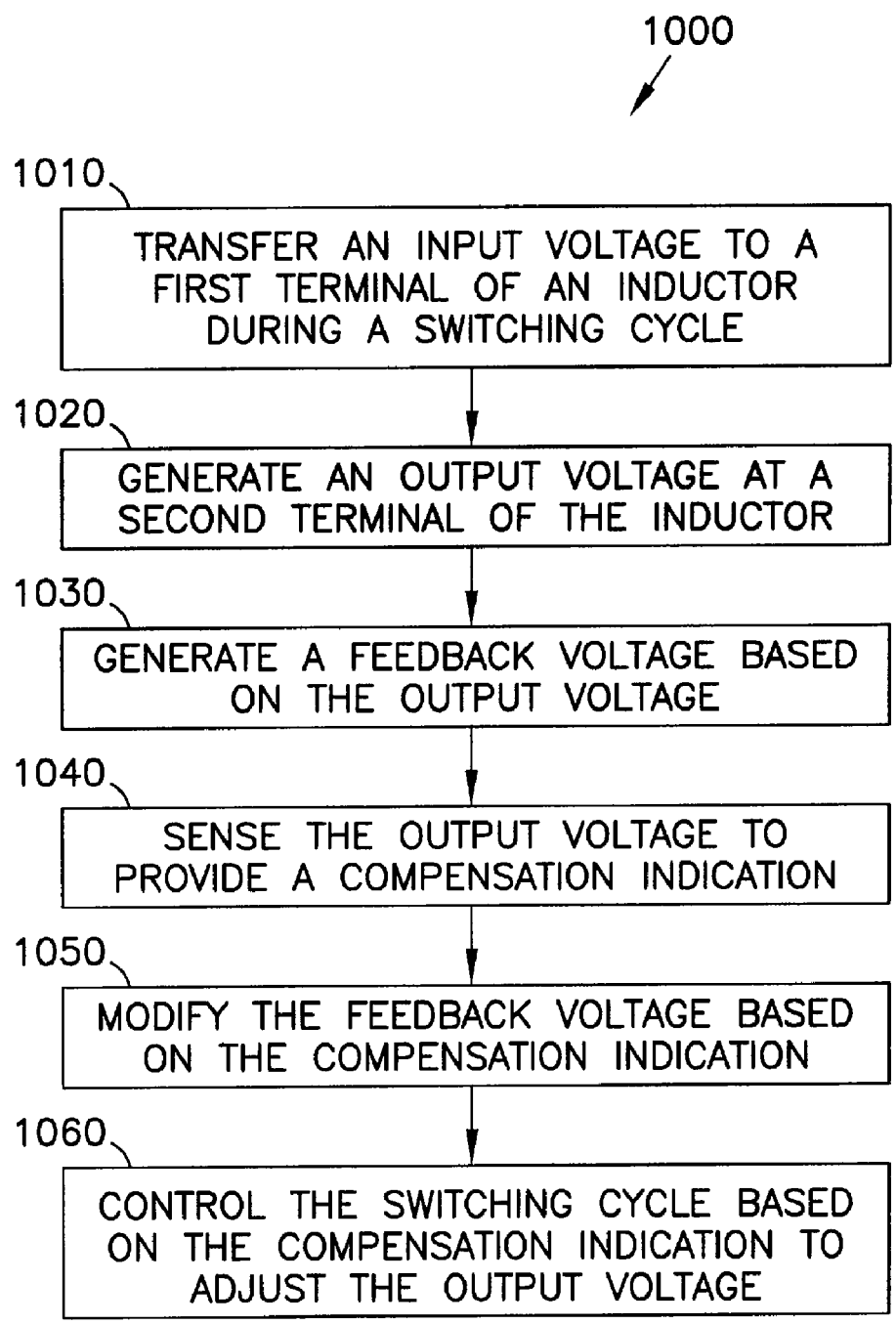
FIG. 10 is a flowchart showing a method according to an embodiment of the invention.

FIG. 10 is a flowchart showing a method 1000 according to an embodiment of the invention. In some embodiments, method 1000 may be used in apparatus 100 of FIG. 1, voltage converters 400 and 800 of FIG. 4 and FIG. 8, and system 900 of FIG. 9. Thus, the circuit elements used in method 1000 may include the circuit elements of the embodiments of apparatus 100, voltage converters 400 and 800, and system 900 as described above.

In method 1000 of FIG. 10, activity 1010 transfers an input voltage to a first terminal of an inductor during a switching cycle. Activity 1020 generates an output voltage at a second terminal of the inductor. Activity 1030 generates a feedback voltage based on the output voltage. Activity 1040 senses the output voltage to provide a compensation indication. Activity 1050 modifies the feedback voltage based on the compensation indication. Activity 1060 controls the switching cycle based on the compensation indication to adjust the output voltage.

The individual activities of method 1000 do not have to be performed in the order shown or in any particular order. Some activities may be repeated, and others may occur only once. Various embodiments of the invention may have more or fewer activities than those shown in FIG. 10. For example, in some embodiments, method 1000 may include the activities or operations of apparatus 100, voltage converters 400 and 800, and system 900 as described in FIG. 1 through FIG. 9.

The above description and the drawings illustrate some specific embodiments of the invention sufficiently to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

What is claimed is:

1. An apparatus comprising:
    a first supply node to receive an input voltage;
    a switch node to provide a switch voltage to an output circuit;
    a sense node to provide a sense voltage based on an output voltage at an output node of the output circuit;
    a control circuit to couple the switch node to the first supply node through a first circuit path based on a feedback voltage, and to decouple the switch node from the first supply node based on the feedback voltage, wherein the control circuit is configured to couple the switch node to the first supply node in a first time interval of a switching cycle, and configured to decouple the switch node from the first supply node in a second time interval of the switching cycle, and wherein the compensation circuit is configured to modify the feedback voltage for a time interval less than a time interval of the switching cycle;
    a feedback circuit including a feedback node to provide the feedback voltage based on the sense voltage; and
    a compensation circuit to modify the feedback voltage based on the sense voltage, wherein compensation circuit includes a circuit path coupled between the feedback node and a second supply node, and wherein the circuit path is configured to be opened and closed to modify the feedback voltage.

2. An apparatus comprising:
    a first supply node to receive an input voltage;
    a switch node to provide a switch voltage to an output circuit;
    a sense node to provide a sense voltage based on an output voltage at an output node of the output circuit;
    a control circuit to couple the switch node to the first supply node through a first circuit path based on a feedback voltage, and to decouple the switch node from the first supply node based on the feedback voltage;
    a feedback circuit including a feedback node to provide the feedback voltage based on the sense voltage, a resistor coupled between the switch node and the feedback node and a capacitor coupled between the feedback node and the sense node; and
    a compensation circuit to modify the feedback voltage based on the sense voltage.

3. The apparatus of claim 2, wherein the compensation circuit includes:
    a resistor coupled between the feedback node and a second supply node;
    a switch coupled between the feedback node and the second supply node; and
    a comparator to control the switch based on the sense voltage.

4. The apparatus of claim 3 wherein the sense node is configured to provide the sense voltage of a first voltage value at a first time, a second voltage value at a second time, and wherein the compensation circuit is configured to modify the feedback voltage only when the sense voltage is less than an average voltage value of the first voltage value and the second voltage value.

5. The apparatus of claim 4, wherein the output circuit includes:
    an inductor coupled between the switch node and the output node of the output circuit; and
    a capacitor coupled between the output node of the output circuit and the second supply node.

6. An apparatus comprising:
    a first supply node to receive an input voltage;
    a switch node to provide a switch voltage to an output circuit;
    a sense node to provide a sense voltage based on an output voltage at an output node of the output circuit;
    a control circuit to couple the switch node to the first supply node through a first circuit path based on a feedback voltage, and to decouple the switch node from the first supply node based on the feedback voltage, wherein the control circuit includes a comparator to compare the feedback voltage with a reference voltage to provide a feedback indication and a switching unit responsive to the feedback indication to couple the switch node to the first supply node and to decouple the switch node from the first supply node;
    a feedback circuit including a feedback node to provide the feedback voltage based on the sense voltage; and
    a compensation circuit to modify the feedback voltage based on the sense voltage, wherein the control circuit includes:
        a first resistor coupled between the feedback node and a second supply node;
        a comparator to compare the sense a voltage with the reference voltage to provide a compensation indication;
        a first switch coupled between the feedback node and the second supply node and responsive to a first combination of the feedback indication and the compensation indication;
        a second resistor coupled between the sense node and the second supply node; and a second switch coupled between the sense node and the second supply node and responsive to a second combination of the feedback indication and the compensation indication.

7. The apparatus of claim 6 further comprising:

a first logic gate having a first input node coupled to an output node of the comparator of the control circuit, a second input node coupled to an output node of the comparator of the compensation control circuit, and an output coupled to the first switch; and a second logic gate having a first input node coupled to the output node of the comparator of the control circuit via an inverter, a second input node coupled to the output node of the comparator of the compensation control circuit, and an output coupled to the second switch.

8. A system comprising:

a first supply node to receive an input voltage;

an output circuit having an output node;

a switch node coupled to the output circuit;

a sense node coupled to the output node;

a control circuit to couple the switch node to the first supply node through a first circuit path based on a feedback voltage, and to decouple the switch node from the first supply node based on the feedback voltage;

a feedback circuit including a feedback node to provide the feedback voltage based on a voltage at the sense node;

a compensation circuit to modify the feedback voltage based on the voltage at the sense node, compensation circuit including a circuit path coupled between the feedback node and a second supply node, the circuit path configured to be opened and closed to modify the feedback voltage;

a core circuit coupled to the output node; and a random access memory device coupled to the core circuit.

9. The system of claim 8, wherein the control circuit, the feedback circuit, the compensation circuit, and the sense node are located on a semiconductor die, and wherein at least a portion of the output circuit is located outside the semiconductor die.

10. The system of claim 9, wherein the output circuit includes:

an inductor coupled between the switch node and the output node; and a capacitor coupled between the output node and a second supply node.

11. The system of claim 10, wherein the sense node is coupled to the inductor of the output circuit via a connection, wherein at least a portion of the connection is located outside the semiconductor die and outside the output circuit.

12. A method comprising:

transferring an input voltage to a first terminal of an inductor during a switching cycle;

generating an output voltage at a second terminal of the inductor;

generating a feedback voltage based on the output voltage;

sensing the output voltage to provide a compensation indication;

modifying the feedback voltage based on the compensation indication, wherein the feedback voltage is generated at a feedback node, and wherein modifying includes at least one of opening and closing a circuit path between the feedback node and a supply node; and controlling the switching cycle based on the compensation indication to adjust the output voltage.

13. The method of claim 12, wherein controlling the switching cycle is performed in the absence of a signal with a non-varying frequency.

14. The method of claim 12, wherein modifying the feedback voltage includes reducing the feedback voltage.

15. The method of claim 12, wherein the closing the circuit path is performed when the feedback voltage is less than an average value of the output voltage.

16. The method of claim 12, wherein the circuit path is closed for only a portion of the switching cycle.

* * * * *